(12) United States Patent
Ikuta

(10) Patent No.: US 7,527,695 B2
(45) Date of Patent: May 5, 2009

(54) APPARATUS AND METHOD FOR CLEANING SUBSTRATE

(75) Inventor: Yoshiaki Ikuta, Schenectady, NY (US)

(73) Assignee: Asahi Glass Company, Limited, Tokyo (JP)

( * ) Notice: Subject to any disclaimer, the term of this patent is extended or adjusted under 35 U.S.C. 154(b) by 456 days.

(21) Appl. No.: 11/471,505

(22) Filed: Jun. 21, 2006

(65) Prior Publication Data

US 2007/0295355 A1 Dec. 27, 2007

(51) Int. Cl.
*B08B 3/12* (2006.01)
*B08B 6/00* (2006.01)
*B08B 7/00* (2006.01)

(52) U.S. Cl. .............................. 134/1; 134/1.1; 134/1.2; 134/1.3

(58) Field of Classification Search ........................ None
See application file for complete search history.

(56) References Cited

U.S. PATENT DOCUMENTS

| | | | | |
|---|---|---|---|---|
| 5,372,651 | A | * | 12/1994 | Kodama ...................... 134/26 |
| 5,882,938 | A | * | 3/1999 | Takahashi et al. ............ 436/151 |
| 6,507,031 | B1 | | 1/2003 | Jinbo et al. |
| 6,982,006 | B1 | * | 1/2006 | Boyers et al. .................. 134/3 |
| 7,416,611 | B2 | * | 8/2008 | Bergman ...................... 134/30 |

FOREIGN PATENT DOCUMENTS

| | | |
|---|---|---|
| JP | 2001-137800 | 5/2001 |
| JP | 2002-16033 | 1/2002 |
| JP | 2002-192089 | 7/2002 |

OTHER PUBLICATIONS

Shinichi Iso, et al., "Study on UV/$O_3$ Cleaning by $Xe_2$* Excimer Lamp", Journal Illuminating Engineering Institute of Japan, vol. 83, No. 5, 1999, pp. 273-277.

* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

To provide a method and apparatus for cleaning a substrate to effectively remove an organic type or metallic type contaminant from a to-be-cleaned surface of a substrate by an increase in the intensity of UV light at the to-be-cleaned surface of the substrate and by an increase in the concentration of ozone $O_3$, excited state oxygen atoms $O(1D)$ and active oxygen.

A method for cleaning a substrate by means of irradiation with UV light, wherein a second space containing a surface on the side of the substrate on which the cleaning is to be carried out (hereinafter referred to as the to-be-cleaned surface) and its vicinity, is an atmosphere comprising a gas or a liquid which generates at least one of ozone, excited state oxygen atoms and active oxygen species by the irradiation with the UV light, a first space containing a surface on the other side of the substrate (hereinafter referred to as the to-be-irradiated surface) is an atmosphere comprising a gas showing a low absorption of the UV light, and the UV light is permitted to enter via the first space into the to-be-irradiated surface of the substrate, then pass through the interior of the substrate and then be applied to the to-be-cleaned surface.

9 Claims, 3 Drawing Sheets

DISTANCE FROM THE TO-BE-CLEANED
SURFACE 2a OF GLASS SUBSTRATE 2

DISTANCE FROM THE TO-BE-CLEANED SURFACE 200a
OF GLASS SUBSTRATE 200

APPARATUS AND METHOD FOR CLEANING SUBSTRATE

BACKGROUND OF THE INVENTION

1. Field of the Invention

The present invention relates to a cleaning apparatus and a substrate cleaning method to clean a substrate consisting of a transparent material such as a glass substrate. More particularly, it relates to an apparatus for cleaning a substrate and a method for cleaning a substrate, capable of efficiently removing an organic type or metallic type contaminant adhered to the substrate surface.

2. Discussion of Background

Irradiation of a substrate surface with ultraviolet light or vacuum ultraviolet light (hereinafter referred to as the UV light) is one of effective cleaning techniques to remove an organic type contaminant or residue from the substrate surface thereby to modify the substrate surface from hydrophobic to hydrophilic. Here, the contaminant is meant for a convex fouling present on the substrate surface, such as particles or fibers, and the residue is meant for an organic type material adsorbed on the substrate surface. Further, as the UV light source for emitting the UV light at the time of cleaning the substrate, a dielectric barrier discharge excimer lamp filled with xenon gas and a mercury lamp may be used. Hereinafter, the UV light in this specification is meant for UV light having a wavelength of from 100 to 400 nm.

A xenon (Xe) excimer lamp, more specifically a dielectric barrier discharge excimer lamp filled with xenon gas, emits a UV light having a center wavelength of 172 nm. The light of 172 nm will be intensely absorbed by oxygen molecules $O_2$ in the atmosphere, whereupon excited state oxygen atoms $O(1D)$ will be formed directly (the following formula (1)) or via ozone $O_3$ (the following formulae (2) and (3)).

$Xe_2$ excimer lamp:

$$O_2 + h\nu(172\ nm) \rightarrow O(1D) + O(3P) \quad \text{Formula (1)}$$

$$O(3P) + O_2 \rightarrow O_3 \quad \text{Formula (2)}$$

$$O_3 + h\nu(172\ nm) \rightarrow O(1D) + O_2 \quad \text{Formula (3)}$$

On the other hand, a low pressure mercury lamp emits UV lights having center wavelengths at 185 nm and 254 nm. The UV light with a wavelength of 185 nm will be absorbed by oxygen molecules $O_2$ in the atmosphere, whereupon ozone $O_3$ will be generated (the following formulae (4) and (5)). This ozone $O_3$ will absorb the UV light of 254 nm to form excited state oxygen atoms $O(1D)$ (the following formula (6)).

Low pressure mercury lamp:

$$O_2 + h\nu(185\ nm) \rightarrow O(3P) + O(3P) \quad \text{Formula (4)}$$

$$O(3P) + O_2 \rightarrow O_3 \quad \text{Formula (5)}$$

$$O_3 + h\nu(254\ nm) \rightarrow O(1D) + O_2 \quad \text{Formula (6)}$$

Excited state oxygen atoms $O(1D)$ and ozone $O_3$ will readily oxidize and decompose an organic compound into $CO$, $CO_2$ and $H_2O$, whereby the organic type contaminant and residue present on the substrate surface will be removed.

Further, when an aqueous solution or gas containing ozone is irradiated with a UV light within a wavelength range from 240 to 260 nm wherein ozone has an absorption band, active oxygen species having an oxidizing force higher than ozone (such as superoxide $O_2^-$, hydroperoxide $HO_2$, hydroxyl radical $OH.$, excited oxygen $O_2^*$, etc.) will be formed. For example, the oxidation-reduction potential of hydroxyl radicals $OH.$ is 2.85 eV, which is higher than that of ozone, 2.07 eV, and thus, an organic type contaminant or residue can be removed more effectively by using the active oxygen species.

Further, when an aqueous solution or a gas containing oxygen gas is irradiated with light having a wavelength of at most 200 nm, excited state oxygen atoms and ozone will be formed, and then or at the same time, if it is irradiated with a UV light within a wavelength range from 240 to 260 nm, or at most 180 nm wherein ozone has an absorption band, the above-mentioned active oxygen species will be formed, whereby it is possible to remove an organic type contaminant or residue effectively.

Further, when an aqueous solution having hydrogen peroxide dissolved therein, is irradiated with UV light having a wavelength of at most 280 nm wherein hydrogen peroxide shows a light absorption, active oxygen species having an oxidizing force higher than hydrogen peroxide such as super oxide $O_2^-$, hydroperoxide $HO_2$, hydroxyl radicals $OH.$, excited oxygen $O_2^*$, etc. will be formed. The oxidation-reduction potential of hydrogen peroxide is 1.78 eV, and hydroxyl radicals being one type of active oxygen species have a higher oxidation-reduction potential. Accordingly, the active oxygen species are capable of removing an organic type contaminant or residue more effectively than hydrogen peroxide.

At the same time, the UV light has a photon energy high enough to cut a molecular bond of an organic compound. Such a dissociation process of a molecular bond by the UV light will promote the decomposition of an organic compound to such gases as $CO$, $CO_2$ and $H_2O$.

In view of the above-mentioned mechanism, in order to carry out cleaning by means of the UV light effectively, presence of ozone $O_3$, excited state oxygen atoms $O(1D)$ or active oxygen species is required, and to generate a substance which promotes such cleaning, it is essential to irradiate an atmosphere wherein at least one of oxygen molecules $O_2$, water molecules, ozone $O_3$ and hydrogen peroxide, is present, with a UV light having a wavelength to be thereby absorbed.

FIG. 4 is a schematic view showing a construction of a conventional substrate cleaning method and substrate cleaning apparatus employing UV light. A substrate cleaning method and substrate cleaning apparatus employing UV light of the construction of this type have heretofore been proposed (Patent Documents 1 to 4).

In FIG. 4, the substrate cleaning apparatus 100 has a process chamber 110 accommodating a substrate 200 to be cleaned, and an UV light source chamber 120 accommodating an UV light source 122 which emits UV light. The UV light source 122 is an UV light source which emits UV light, such as a xenon (Xe) excimer lamp or a low pressure mercury lamp.

In the process chamber 110, the substrate 200 is positioned at a predetermined distance (usually from 1 to 10 mm) from the UV light source 122 and supported by a substrate holder 112 so that its surface 200a to be cleaned will face the UV light source 122. The process chamber 110 has an inlet 114 and outlet 116 for a process gas. The inlet 114 and outlet 116 are used to let a process gas flow in the process chamber 110 when the substrate 200 is to be cleaned. As the process gas, a gas containing water vapor or $O_2$ is usually employed. Specifically, $O_2$ gas, a mixed gas of $O_2$ and $N_2$, humidified $N_2$ gas or air is, for example, employed.

On the other hand, the UV light source chamber 120 has an inlet 124 and outlet 126 for an inert gas. The inlet 124 and outlet 126 are used to let an inert gas having a low absorbance at the wavelength of UV light to be used, such as $N_2$, Ar or He, flow in the UV light source chamber 120. By letting the inert gas flow in the UV light source chamber 120, attenuation of the UV light emitted from a lamp 122 before it reaches the process chamber 110, will be prevented.

A window 128 is provided between the process chamber 110 and the UV light source chamber 120. The window 128 is made of a material having a low absorption at the wavelength of UV light to be used, such as quartz glass. The UV light emitted from the lamp 122 will pass through the window 128 and enter into the process chamber 110.

Accordingly, in the case of such a conventional substrate cleaning apparatus 100, the process chamber 110, more specifically, the space between the window 128 and the surface 200a of the substrate 200 to be cleaned, is filled with a process gas containing water vapor or $O_2$. Water vapor or $O_2$ gas has a strong absorption in an ultraviolet light region and a vacuum ultraviolet light region (for example, the absorption cross-sectional area of $O_2$ molecules at 172 nm is $6 \times 10^{17}$ $cm^2$), and the UV light accordingly attenuates sharply as it approaches the surface 200a of the substrate 200 to be cleaned, whereby the intensity of the UV light will decrease. In a case where the process gas flowing in the process chamber 110 is a laminar flow, due to the decrease of the UV light intensity, the concentration of $O_3$, excited state oxygen atoms and active oxygen also decrease as it approaches the surface 200a of the substrate 200 to be cleaned.

FIG. 5 is a graph showing a distribution of the intensity of UV light, and the concentrations of ozone $O_3$, excited state oxygen atoms O(1D) and active oxygen in a conventional substrate cleaning apparatus, in the region between the window 128 and the surface 200a of the substrate 200 to be cleaned. As is evident from FIG. 5, the intensity of UV light and the concentrations of ozone $O_3$ and excited state oxygen atoms O(1D) are the maximum in the vicinity of the window 128 and rapidly decrease as they approach the surface 200a of the substrate 200 to be cleaned.

In order to obtain a high intensity of UV light at the surface 200a to be cleaned, it is necessary to lower the concentration of water vapor or $O_2$ gas in the process gas, but if such a concentration is lowered, the concentrations of ozone $O_3$, excited state oxygen atoms and active oxygen at the surface 200a to be cleaned will also decrease.

Further, in order to have the surface 200a of the substrate 200 to be cleaned, irradiated with UV light with a sufficiently high irradiation intensity, it is necessary to emit UV light of high intensity to the window 128. Accordingly, window 128 begins to have absorption due to high intensity UV light and needs to be changed periodically to maintain a sufficiently high irradiation intensity of UV light at the surface 200a to be cleaned.

Also in a case where the flow of the process gas is a turbulent flow, ozone $O_3$, excited state oxygen atoms O(1D) and active oxygen will have short lifetime and can not reach the surface 200a of the substrate 200 to be cleaned.

Consequently, at the surface 200a of the substrate 200 to be cleaned, the intensity of UV light and the concentrations of ozone $O_3$, excited state oxygen atoms O(1D) and active oxygen, are not enough to effectively clean the surface 200a to be cleaned.

Further, according to cited document 1, in order to remove an organic substance effectively from the surface to be cleaned, it is necessary to supply both UV light and ozone gas, excited state oxygen atoms or active oxygen simultaneously to the surface to be cleaned. With only one of them, in other words, irradiation with UV light in an inert gas atmosphere not containing ozone gas, excited state oxygen atoms or active oxygen, or exposure to an atmosphere in which only ozone gas, excited oxygen atoms or active oxygen is present without UV light irradiation, it is not possible to sufficiently remove an organic substance from the surface to be cleaned.

Patent Document 1: JP-A-2002-16033
Patent Document 2: JP-A-2001-137800
Patent Document 3: U.S. Pat. No. 6,507,031
Patent Document 4: JP-A-2002-192089
Cited Document 1: Journal of Illuminating Engineering Institute of Japan, vol 83, No. 5, p. 273

SUMMARY OF THE INVENTION

In order to solve the problems of the prior art as described above, it is an object of the present invention to provide a method and apparatus for cleaning a substrate, whereby the effect for cleaning a substrate i.e. the efficiency for removal of organic type and metal type contaminants from the surface of the substrate to be cleaned, is improved by an increase in the intensity of UV light and by a consequent increase in the concentrations of ozone $O_3$, excited state oxygen atoms O(1D) and active oxygen, at the surface of the substrate to be cleaned.

To accomplish the above object, the present invention provides a method for cleaning a substrate, which comprises irradiating the substrate to be cleaned with ultraviolet light or vacuum ultraviolet light (hereinafter referred to simply as the UV light), wherein the substrate to be cleaned is a substrate having a transmittance of at least 20% at the wavelength of the UV light; a second space containing a surface on the side of the substrate on which the cleaning is to be carried out (hereinafter referred to as the to-be-cleaned surface) and its vicinity, is an atmosphere comprising a gas (hereinafter referred to as the process gas) or a liquid (hereinafter referred to as the process liquid), which generates at least one of ozone, excited state oxygen atoms and active oxygen species by the irradiation with the UV light; a first space containing a surface on the other side of the substrate (hereinafter referred to as the to-be-irradiated surface) is an atmosphere comprising a gas showing a low absorption of the UV light; and the UV light is permitted to enter via the first space into the to-be-irradiated surface of the substrate, then pass through the interior of the substrate and then be applied to the to-be-cleaned surface.

In the method for cleaning a substrate according to the present invention, the UV light is preferably emitted from at least one UV light source selected from the group consisting of a mercury lamp (peak wavelength of emitted light: 185 nm and/or 254 nm), a dielectric barrier discharge excimer lamp filled with xenon gas (172 nm), a dielectric barrier discharge excimer lamp filled with KrCl gas (222 nm), a dielectric barrier discharge excimer lamp filled with XeI gas (254 nm), a dielectric barrier discharge excimer lamp filled with Ar gas (146 nm), a fourth harmonic wavelength YAG:Nd laser (266 nm), an ArF excimer laser (193 nm), a $F_2$ laser (157 nm) and a KrF excimer laser (248 nm).

In the method for cleaning a substrate according to the present invention, the irradiation intensity of the UV light applied to the substrate is preferably at least 5 mW/$cm^2$ at the to-be-cleaned surface of the substrate.

In the method for cleaning a substrate according to the present invention, the process gas is preferably a gas comprising either $O_2$ gas, water vapor, or $O_2$ gas and water vapor.

Further, in the method for cleaning a substrate according to the present invention, the process gas preferably has an $O_2$ concentration of from 1 to 100%, particularly preferably from 20 to 100 volume %.

Further, in the method for cleaning a substrate according to the present invention, the process liquid is preferably either deionized water, deionized water containing a surfactant, deionized water containing an oxidizing agent, an aqueous acidic solution or an aqueous alkaline solution.

In the method for cleaning a substrate according to the present invention, the substrate is preferably one selected from the group consisting of a synthetic quartz glass substrate, a fused quartz glass substrate, a $TiO_2$-doped quartz glass substrate, a sapphire ($Al_2O_3$) substrate, a $CaF_2$ substrate and a $MgF_2$ substrate, and particularly preferably, the substrate is a synthetic quartz glass substrate having a water content of at most 500 ppm or an ultra-low thermal expansion glass substrate having a thermal expansion coefficient of at most 10 ppb/K.

Further, the present invention provides an apparatus for cleaning a substrate, which comprises a process chamber, and an UV light source for emitting the UV light, to clean a substrate accommodated in the process chamber, wherein the process chamber is provided with a first space to contain the to-be-irradiated surface of the substrate and a second space to contain the to-be-cleaned surface of the substrate, when the substrate is accommodated therein, the first space is designed to have a gas showing a low absorption of the UV light introduced thereto to form an atmosphere comprising the gas, the second space is designed to have the process gas or the process liquid introduced thereto to form an atmosphere comprising the process gas or the process liquid, and the UV light emitted from the UV light source is permitted to enter via the first space into the to-be-irradiated surface of the substrate, then pass through the interior of the substrate and then be applied to the to-be-cleaned surface, to clean the substrate.

In the apparatus for cleaning a substrate according to the present invention, the UV light source for emitting the UV light is preferably at least one UV light source selected from the group consisting of a mercury lamp (peak wavelength of emitted light: 185 nm and/or 254 nm), a dielectric barrier discharge excimer lamp filled with xenon gas (172 nm), a dielectric barrier discharge excimer lamp filled with KrCl gas (222 nm), a dielectric barrier discharge excimer lamp filled with XeI gas (254 nm), a dielectric barrier discharge excimer lamp filled with Ar gas (146 nm), a fourth harmonic wavelength YAG:Nd laser (266 nm), an ArF excimer laser (193 nm), a $F_2$ laser (157 nm) and a KrF excimer laser (248 nm).

According to the present invention, the efficiency for cleaning a substrate is improved by the following reasons.

(1) Without attenuating UV light reaching the to-be-cleaned surface of the substrate, it is possible to increase the concentration of a component to form ozone $O_3$, excited state oxygen atoms O(1D) and active oxygen, in the vicinity of the to-be-cleaned surface of the substrate, such as the $O_2$ concentration in the atmospheric gas.

(2) Consequently, at the to-be-cleaned surface of the substrate, high concentrations of ozone $O_3$, excited state oxygen atoms O(1D) and active oxygen, can be obtained together with high intensity UV light.

(3) The intensity of UV light, and the concentrations of ozone $O_3$, excited state oxygen atoms O(1D) and active oxygen, in the vicinity of the to-be-cleaned surface of the substrate, can be independently controlled.

According to the present invention, a substrate for a photomask or photomask blank can be cleaned with a high cleaning efficiency. Namely, an organic type or metallic type contaminant, particularly an organic contaminant, present on such a surface can efficiently be removed. Further, a window between a process chamber and an UV light source chamber is not necessarily required. In a case where no window is employed, there will be no absorption loss or surface reflection loss of UV light by a window, whereby the irradiation intensity of UV light to the to-be-cleaned surface can be made higher. Further, there will be a merit in that no maintenance of a window is required. Even in a case where a window is employed, the irradiation intensity at the to-be-cleaned surface can be made equal, even if the UV light intensity passing through the window is made lower, whereby deterioration of the window can be suppressed.

Figure 1:
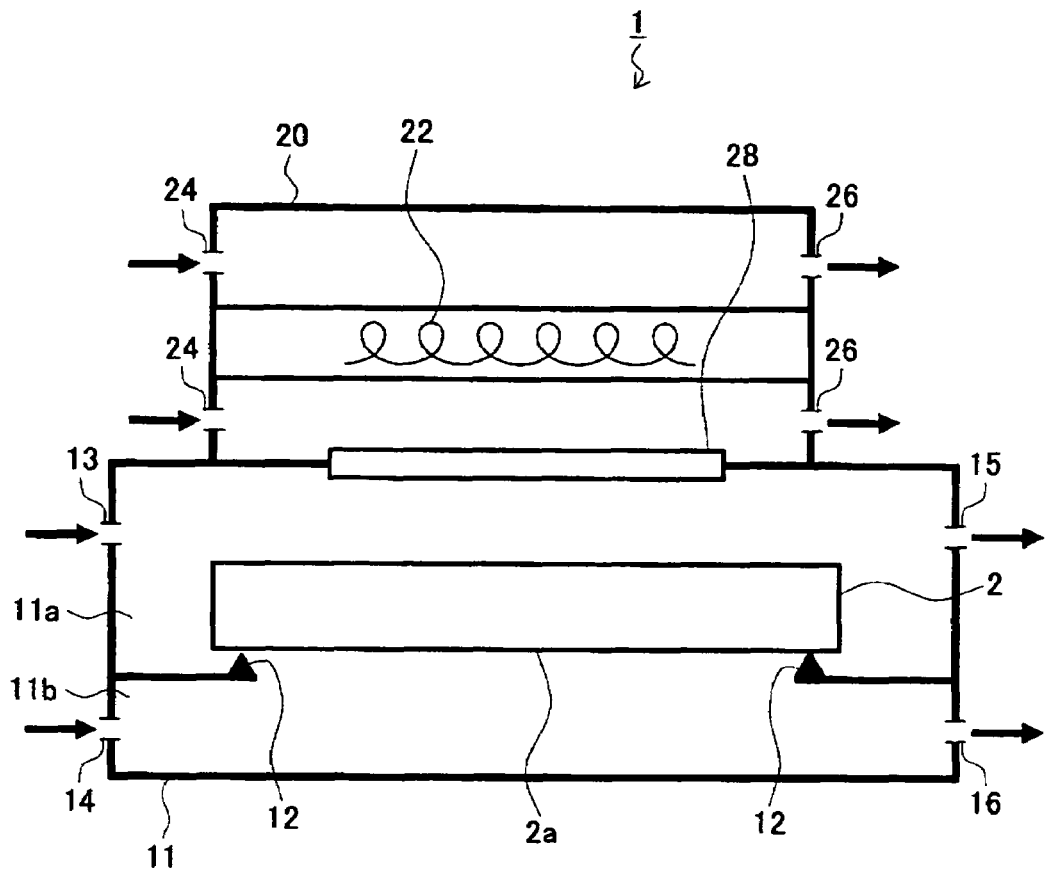
FIG. 1 is a schematic view showing an example of the construction of the apparatus for cleaning a substrate according to the present invention.

In the Figs., reference numeral 1 represents an apparatus for cleaning a substrate, 2 a substrate, 2a a to-be-cleaned surface, 11 a process chamber, 11a a first space, 11b a second space, 12 a substrate holder, 13, 14 inlets, 15, 16 outlets, 18 a nozzle, 18a a process liquid, 19 a support plate, 19a a shaft, 20 an UV light source chamber, 22 an UV light source, 24 an inlet, 26 an outlet, 28 a window, 100 an apparatus for cleaning a substrate, 110 a process chamber, 112 a substrate holder, 114 an inlet, 116 an outlet, 120 an UV light source chamber, 122 an UV light source, 124 an inlet, 126 an outlet, 128 a window, 200 a substrate, and 200a a to-be-cleaned surface

DETAILED DESCRIPTION OF THE PREFERRED EMBODIMENTS

Figure 4:
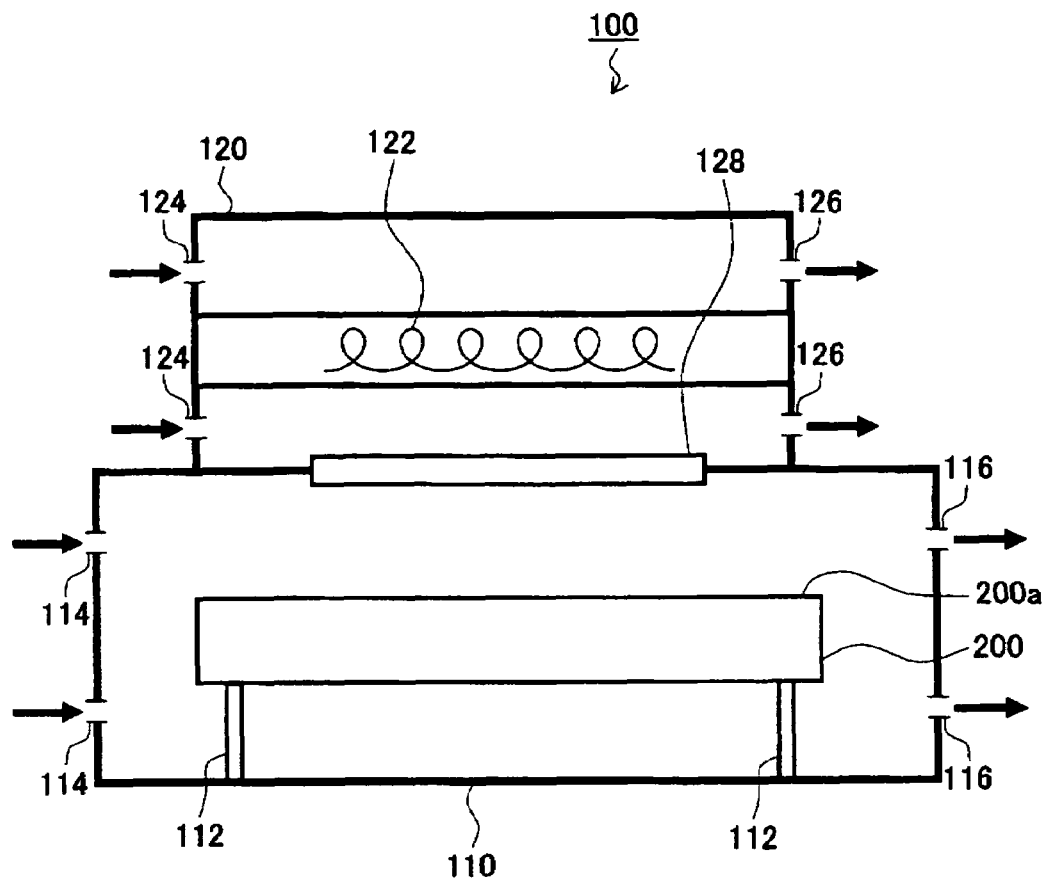
FIG. 4 is a schematic view showing a construction of a conventional apparatus for cleaning a substrate, employing UV light.

FIG. 1 is a schematic view illustrating one embodiment of a substrate cleaning method and a substrate cleaning apparatus for cleaning a substrate according to the present invention, and the method and apparatus for cleaning a substrate of the present invention are not limited thereto. In the embodiment shown in FIG. 1, a substrate cleaning apparatus 1 is the same as a conventional substrate cleaning apparatus 100 as shown in FIG. 4 to such an extent that it has a process chamber 11 to accommodate a substrate 2 to be cleaned and an UV light source chamber to accommodate an UV light source 22.

In the substrate cleaning apparatus 1 shown in FIG. 1, when the substrate 2 is disposed in the process chamber 11, the process chamber 11 is structurally divided into two spaces i.e. a first space 11a and a second space 11b, so that the atmospheres of the first and second spaces 11a and 11b will not be mixed with each other.

As shown in FIG. 1, the portion corresponding to the first space 11a of the process chamber 11 is provided with an inlet 13 and outlet 15 for a gas. Further, the UV light source chamber 20 is provided with an inlet 24 and outlet 26 for a gas. When the substrate cleaning apparatus 1 as shown in FIG. 1 is used, a gas having a low absorption of UV light, such as $N_2$, Ar or He, is permitted to flow by means of the inlet 13 and outlet 15, so that the first space 11a is filled with the gas having a low absorption of UV light. Further, by means of the inlet 24 and outlet 26, a gas having a low absorption of UV light, such as $N_2$, Ar or He, is permitted to flow, so that the space in the UV light source chamber is filled with the gas having a low absorption of UV light. The gas to fill the first space 11a and the UV light source chamber may be any gas having a low absorption of UV light emitted from the UV light source 22. Among them, $N_2$, He and Ar is preferred, since it has a low absorption of UV light and is relatively inexpensive.

As shown in FIG. 1, the portion corresponding to the second space 11b of the process chamber 11 is provided with an inlet 14 and outlet 16 for a process gas or process liquid. When the substrate cleaning apparatus 1 shown in FIG. 1 is used, a process gas or process liquid is supplied to the second space 11b from the inlet 14.

As will be described in detail hereinafter, in this specification, the process gas or process liquid is meant for a gas or liquid which generates, when irradiated with UV light, at least one of ozone $O_3$, excited state oxygen atoms O(1D) and active oxygen, by the mechanism as discussed in Background of the Invention.

In the substrate cleaning apparatus 1 shown in FIG. 1, the first space 11a and the second space 11b are structurally divided in a state where the substrate 2 to be cleaned, is accommodated, whereby at least in the space 11a, there will be substantially no mixing of the gas having a low absorption of UV light filled in the first space with the process gas supplied to the second space. Further, in the substrate cleaning apparatus 1 of the construction as shown in FIG. 1, the UV light source chamber and the first space are partitioned by a window 28, but the window 28 may be omitted, such being preferred in that there will be no attenuation of the intensity of UV light by the window 28.

In order to effectively remove an organic substance, both the UV light, and ozone or active oxygen are required at the surface 200a to be cleaned (Cited Document 1). In the conventional substrate cleaning apparatus 100 shown in FIG. 4, UV light emitted to the substrate 200 will act on $O_2$ gas or water vapor in the process gas to generate ozone $O_3$, excited state oxygen atoms O(1D) or active oxygen, but, at that time, the UV light will be absorbed by the process gas, so that the intensity of the UV light reached to the to-be-cleaned surface of the substrate will be low. In order to increase the intensity of the UV light at the to-be-cleaned surface 200a, it is necessary to increase the light intensity of the light source or to reduce the water vapor or oxygen concentration in the process gas. However, with respect to the light intensity of the light source, there is a restriction from the viewpoint of the apparatus, and if the concentration of $O_2$ gas, water vapor, or $O_2$ gas and water vapor, in the process gas, is lowered, it will be difficult to bring ozone $O_3$, excited state oxygen atoms O(1D) or active oxygen to a high concentration in the vicinity of the to-be-cleaned surface.

Whereas, in the case of the substrate cleaning apparatus 1 shown in FIG. 1, the substrate 2 is disposed in the process chamber 10 so that the to-be-cleaned surface 2a is located on the second space 11b side i.e. on the rear side to the UV light source 22. Accordingly, the UV light from the UV light source 22 is permitted to enter into the substrate 2 from the to-be-cleaned irradiated surface, then pass through the interior of the substrate and then be applied to the to-be-cleaned surface 2a. And, by cutting the molecular bond, an organic type contaminant or residue adhered to the substrate surface will be removed. Further, the UV light emitted from the to-be-cleaned surface 2a will act on the process gas or process liquid in the second space 11b in the vicinity of the to-be-cleaned surface 2a to generate at least one of ozone $O_3$, excited state oxygen atoms O(1D) and active oxygen, whereby an organic type contaminant or residue present on the substrate surface will be removed.

The first space 11a including a light path ranging from the window 28 to the substrate 2, is filled with a gas having a low absorption of UV light, whereby attenuation of the UV light before reaching to the substrate 2 is thereby reduced. Therefore, irrespective of the concentration of water vapor or $O_2$ in the process gas in the second space 11b, a high intensity of UV light can be realized at the to-be-cleaned surface 2a of the substrate 2. As a result, it is possible to make the concentration of ozone $O_3$, excited state oxygen atoms O(1D) and active oxygen generated by irradiation with UV light high in the vicinity of the to-be-cleaned surface 2a of the substrate 2.

Figure 2:
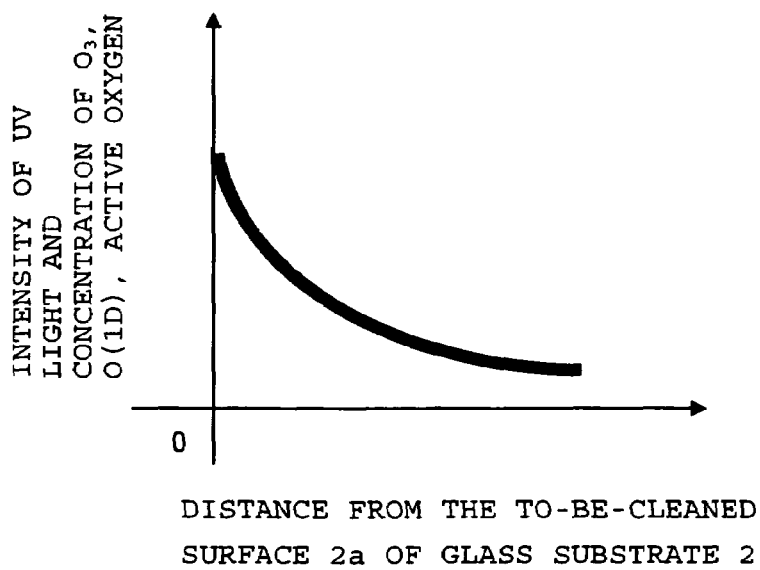
FIG. 2 is a graph showing the distribution of the intensity of UV light and the concentrations of ozone $O_3$, excited state oxygen atoms O(1D) and active oxygen, at the second space 11b of the apparatus 1 for cleaning a substrate shown in FIG. 1.
Figure 5:
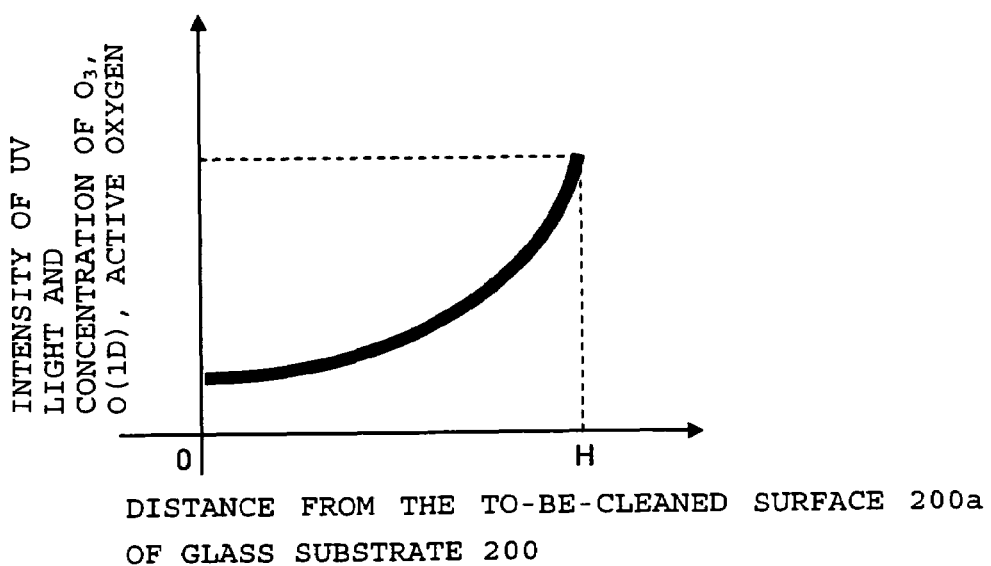
FIG. 5 is a graph showing a distribution of the intensity of UV light and the concentrations of ozone $O_3$, excited state oxygen atoms O(1D) and active oxygen, in a region between a window 128 and a to-be-cleaned surface 200a of the substrate 200 of the apparatus 100 for cleaning a substrate shown in FIG. 4.

FIG. 2 is a view similar to FIG. 5 and shows the distribution of the intensity of UV light, and the concentrations of ozone $O_3$, excited state oxygen atoms O(1D) and active oxygen, in the second space 11b of the substrate cleaning apparatus 1 shown in FIG. 1. As is evident from FIG. 2, the intensity of UV light, and the concentrations of ozone $O_3$, excited state oxygen atoms O(1D) and active oxygen, are highest in the vicinity of the to-be-cleaned surface 2a of the substrate and sharply decrease as they depart from the to-be-cleaned surface 2a. Further, in FIG. 2, the flow of the process gas is a laminar flow. This situation is the same even in the case the flow of the process gas is a turbulent flow.

In the substrate cleaning apparatus of FIG. 1, when the substrate 2 is disposed in the process chamber 11, the interior of the process chamber is structurally divided into the first space 11a and the second space 11b by the wall surface of the chamber, the substrate holder 12 and, if necessary, a gasket, etc. However, when the substrate 2 is not placed, the process chamber 11 is not divided into the first space 11a and the second space 11b and constitutes one space.

In the process chamber 11, the first space 11a and the second space 11b may be designed so that when the substrate 2 is disposed, there will be substantially no mixing of the gas having a low absorption of UV light filled in the first space with the process gas or process liquid supplied to the second space. The design may be such that at least the process gas or process liquid supplied to the second space will not substantially enter into the first space.

When the substrate is not disposed, the process chamber may form one space like the construction as shown in FIG. 1, or may always be divided into two spaces, for example, by providing a window and a shutter.

Further, when the substrate is disposed, the process chamber may be composed solely of the first space and the second space separated by the disposed substrate like the construction shown in FIG. 1, or a part of the process chamber may be divided into a first space containing the to-be-irradiated surface of the substrate and a second space containing the to-be-cleaned surface of the substrate.

In the substrate cleaning apparatus 1 shown in FIG. 1, the first space 11a is a portion located between the UV light source chamber 20 and the substrate 2 in the process chamber 11. However, as shown in FIG. 1, when the process chamber 11 is structurally divided into the two spaces by the substrate 2, the first space 11a means the entire space on the side located between the UV light source chamber 20 and the substrate 2, and does not mean only a part of the same space i.e. only a part of the UV light source chamber 20 corresponding to the upper portion of the to-be-irradiated surface of the substrate 2 (i.e. the upper side of the substrate 2 in FIG. 1).

In the substrate cleaning method of the present invention, as the atmosphere of the second space 11b, a process gas may be employed as described above, but it is possible to use a process liquid instead.

When a process liquid is used, as compared with a case where a process gas is used, a contaminant can easily be removed from the surface of the substrate. It is particularly preferred to design so that a process liquid will flow on the to-be-cleaned surface. In the presence of such a flow, a liquid usually has a density higher than a gas, whereby a larger momentum can be transmitted to the contaminant. Further, in the case of a process liquid, the surface potentials of the contaminant and the substrate surface can be controlled to some extent by adjusting its pH, and by adjusting the pH and ion concentration so that the surface potentials of the contaminant and the substrate surface become the same charges, it is possible to promote detachment of the contaminant from the substrate surface or to suppress re-deposition of the contaminant on the substrate surface, such being desirable. For example, in the case of an aqueous solution having ammonia added to bring pH=8 to 12, $SiO_2$, Si and an organic type contaminant (such as a polystyrene latex) respectively have negative surface potentials thereby to repel one another.

As compared with a case where a process gas is used, in the case where a process liquid is used, absorption of UV light in the vicinity of the to-be-cleaned surface 2a of the substrate 2 becomes high, whereby it becomes possible to increase the concentrations of ozone $O_3$, excited state oxygen atoms O(1D) and active hydrogen in the vicinity of the to-be-cleaned surface 2a of the substrate 2.

Further, in a case where a basic aqueous solution having a pH of at least 9 and/or deionized water containing an oxidizing agent, is employed as the process liquid, decomposition of ozone formed by irradiation with UV light will be accelerated, whereby excited state oxygen atoms and active oxygen can be formed in higher concentrations in the vicinity of the to-be-cleaned surface 2a of the substrate 2. As the oxidizing agent, hydrogen peroxide ($H_2O_2$) is preferably employed, but the oxidizing agent is not limited thereto.

Further, in a case where an acidic aqueous solution having a pH of at most 4 is employed as the process liquid, most metals can be ionized and dissolved to form aqueous solutions. Accordingly, it is preferred to employ deionized water containing an acid such as hydrochloric acid or hydrofluoric acid in a case where the main purpose is to remove a metal type contaminant or attachment or metal remaining on the surface.

As shown in FIG. 5, in the case of a conventional substrate cleaning apparatus 100, the intensity of UV light and the concentrations of ozone $O_3$, excited state oxygen atoms O(1D) and active oxygen are highest in the vicinity of a window 128 and sharply decrease as they approach to the to-be-cleaned surface 200a of the substrate 200, whereby it is difficult to irradiate the to-be-cleaned surface 2a of the substrate with high intensity UV light and at the same time to expose it to highly concentrated ozone $O_3$, excited oxygen atoms O(1D) and active oxygen.

Whereas in the case of the substrate cleaning apparatus 1 of the present invention, as shown in FIG. 2, application of high intensity UV light to the to-be-cleaned surface 2a of the substrate 2 and to the space in the vicinity of the to-be-cleaned surface 2a can be realized. Further, the light path of UV light to the to-be-cleaned surface 2a, contains no atmosphere containing a process gas or a process liquid, whereby irradiation with high intensity UV light can be accomplished irrespective of the concentrations of $O_2$ or $H_2O$ contained in the process gas or a process liquid. Accordingly, the intensity of UV light and the concentrations of ozone $O_3$, excited state oxygen atoms O(1D) and active oxygen at the to-be-cleaned surface 2a of the substrate 2 can be independently controlled.

In order to independently control the intensity of UV light and the concentrations of ozone $O_3$, excited state oxygen atoms O(1D) and active oxygen at the to-be-cleaned surface 2a of the substrate 2, specifically, the following procedure may be followed. For example, in order to increase both the intensity of UV light and the concentrations of ozone $O_3$, excited state oxygen atoms O(1D) and active oxygen, the intensity of UV light from the UV light source 22 may be increased. When the intensity of UV light from the UV light source 22 is increased, also the concentrations of ozone $O_3$, excited state oxygen atoms O(1D) and active oxygen formed by the irradiation with the UV light will be increased. In order to increase only the concentrations of ozone $O_3$, excited state oxygen atoms O(1D) and active oxygen without changing the intensity of UV light from the UV light source 22, the concentrations of $O_2$, $H_2O$ or $H_2O_2$ contained in a process gas or a process liquid may be increased which forms ozone $O_3$, excited state oxygen atoms O(1D) and active oxygen by irradiation with the UV light, or the amount of the process gas or process liquid to be supplied, may be increased. Still further, in order to increase the intensity of UV light from the UV light source 22 without increasing the concentrations of ozone $O_3$, excited state oxygen atoms O(1D) and active oxygen, the concentration of $O_2$, $H_2O$ or $H_2O_2$ contained in a process gas or a process liquid may be lowered which forms ozone $O_3$, excited state oxygen atoms O(1D) and active oxygen by the irradiation with the UV light, or the amount of a process gas or a process liquid to be supplied, may be lowered, while the intensity of the UV light from the UV light source 22 is increased. As mentioned above in Background of the Invention, in cleaning by means of UV light, an organic compound present on a substrate surface is not only decomposed by ozone $O_3$, excited state oxygen atoms O(1D) or active oxygen formed by the irradiation with the UV light, but also the UV light directly dissociates the molecular bond of the organic compound, whereby the compound will be decomposed into gases such as CO, $CO_2$ and $H_2O$. Accordingly, even if the concentrations of ozone $O_3$ and excited state oxygen atoms O(1D) in the vicinity of the to-be-cleaned surface 2a of the substrate 2, are decreased, the effect for cleaning the to-be-cleaned surface 2a of the substrate 2 will not necessarily be decreased.

In this specification, when it is stated that the process chamber 11 is structurally divided into a first space 11a and a second space 11b, it means such a state that a gas in one space will not diffuse to the other space. Accordingly, it is preferably a state which satisfies each of the following conditions (a) and (b).

(a) The inert gas in the first space 11a will not diffuse to the second space 11b.

(b) The process gas (or a gas formed by vaporization of a process liquid) in the second space 11b will not diffuse to the first space 11a.

In order to satisfy both the above conditions (a) and (b) in the substrate cleaning apparatus 1 shown in FIG. 1, the boundary between the first space 11a and the second space 11b may be airtightly sealed. More specifically, the junction between the substrate 2 and the substrate holder 12 may be airtightly sealed by means of a gasket or the like.

In the substrate cleaning apparatus 1 shown in FIG. 1, in order to prevent attenuation of UV light from the UV light source 22 before it reaches the substrate 2, the first space 11a may be filled with an inert gas. Accordingly, the substrate cleaning apparatus 1 shown in FIG. 1 may be adapted at least to satisfy the above condition (b) i.e. in such a state that the process gas (or a gas formed by vaporization of a process liquid) in the second space 11b will not diffuse to the first space 11a.

This may be accomplished also by controlling so that the pressure in the first space 11a will be higher than the pressure in the second space 11b. In such a case, the pressure difference between the pressure in the first space 11a and the pressure in the second space 11b is preferably from 2 mmH$_2$O to 50 mmH$_2$O, more preferably from 5 mmH$_2$O to 30 mmH$_2$O.

The process gas or process liquid to be supplied to the second space 11b may be any gas or liquid so long as it is capable of generating at least one of ozone O$_3$, excited state oxygen atoms O(1D) and active oxygen by the mechanism as described above in Background of the Invention when irradiated with UV light.

As the process gas, it is preferred to employ a gas containing either O$_2$ gas, water vapor, or O$_2$ gas and water vapor. A specific example of the process gas may, for example, be O$_2$ gas, a mixed gas of O$_2$ and N$_2$, atmospheric air, N$_2$ gas humidified with deionized water, Ar gas or He gas, or a mixed gas thereof. Among them, a gas containing O$_2$ i.e. O$_2$ gas, a mixed gas of O$_2$ and N$_2$, or air, is preferred, since a larger amount of ozone O$_3$ or excited state oxygen atoms O(1D) can be generated when irradiated with UV light. When a gas containing O$_2$ is to be used, it is preferred that O$_2$ in the gas is from 1 to 100%, more preferably from 20 to 100%, whereby a larger amount of ozone O$_3$, excited state oxygen atoms O(1D) or active oxygen species can be generated, when the gas is irradiated with UV light.

As the process liquid, it is preferred to employ either deionized water, deionized water containing a surfactant, deionized water containing an oxidizing agent, an acidic aqueous solution or a basic aqueous solution.

The oxidizing agent may, for example, be hydrogen peroxide (H$_2$O$_2$), ozone water, sulfuric acid or hydrofluoric acid.

A specific example of the acidic aqueous solution may be aqueous solution of an inorganic acid such as hydrochloric acid (HCl), hydrofluoric acid (HF), nitric acid (HNO$_3$) or sulfuric acid (H$_2$SO$_4$), an aqueous solution of an organic acid such as propionic acid (C$_3$H$_8$COOH), citric acid (C$_6$H$_8$O$_7$), acetic acid (CH$_3$COOH) or formic acid (HCOOH), or a mixture thereof.

A specific example of the basic aqueous solution may be an aqueous solution containing ammonia (NH$_3$), potassium hydroxide (KOH), sodium hydroxide (NaOH) or an organic amine.

Further, a surfactant and/or an oxidizing agent may be mixed to the acidic aqueous solution or the basic aqueous solution for use.

Among the above process liquids, it is preferred to employ deionized water containing hydrogen peroxide (H$_2$O$_2$) when an organic type contaminant, residue or attachment is to be removed, whereby highly concentrated ozone, excited oxygen atoms and active oxygen can be generated. A preferred concentration of hydrogen peroxide is from 0.001 to 30 mass %, more preferably from 0.1 to 2 mass %.

Further, for the same reason, it is preferred to employ an aqueous solution containing ammonia (NH$_3$), and in a case where ammonia is contained, a preferred pH range is pH=8 to 14, more preferably pH=9 to 12.

Further, it is more preferred that at the same time as using deionized water containing hydrogen peroxide or an aqueous solution containing ammonia, UV light having a wavelength of at most 200 nm and UV light having a wavelength in the vicinity of from 240 nm to 260 nm are simultaneously used as the UV light for irradiation, whereby it is possible to prevent re-deposition on the substrate surface of particles detached from the substrate surface. Further, it is further preferred to employ an aqueous solution containing hydrogen peroxide and ammonia, whereby it is possible to clean and remove a contaminant more effectively.

Further, in a case where an organic type contaminant, residue or attachment is to be removed, it is preferred that among the above process liquids, deionized water containing ozone (concentration: 1 to 200 weight ppm, preferably 30 to 100 weight ppm) is irradiated with UV light having a wavelength of 240 to 260 nm, whereby active oxygen can be generated.

Further, in a case where a metal type contaminant, residue or attachment is to be removed, it is preferred that among the above process liquids, an aqueous solution containing an inorganic acid such as hydrofluoric acid (HF), nitric acid (HNO$_3$) or sulfuric acid (H$_2$SO$_4$) or an aqueous solution containing an organic acid such as propionic acid (C$_3$H$_8$COOH) or acetic acid (CH$_3$COOH), is irradiated with UV light having a wavelength of at most 200 nm, or simultaneously with UV light having a wavelength of at most 200 nm and UV light having a wavelength in the vicinity of from 240 to 260 nm, whereby the metal can be ionized and dissolved. A preferred pH range is pH=1 to 5, particularly preferably pH=1 to 3.

The process gas or process liquid in contact with the to-be-cleaned surface 2a in the second space 11b may be in a flowing state or in a stationary state. It is preferred that the process gas or process liquid is made to be in a flowing state, since it is thereby possible to make the concentrations of O$_2$, ozone O$_3$, excited state oxygen atoms O(1D) and active oxygen species uniform in the vicinity of the to-be-cleaned surface 2a of the substrate 2. The manner for letting the gas flow is not limited to one shown in FIG. 1, and it may be blown to the to-be-cleaned surface.

The gas having a low absorption of UV light filled in the first space may also be in a flowing state or in a stationary state. The manner for letting the gas to flow is not limited to one shown in FIG. 1, and, for example, the second space may be made a positive pressure to the first space, so that the gas having a low absorption of UV light will leak to some extent from the first space to the second space.

Figure 3:
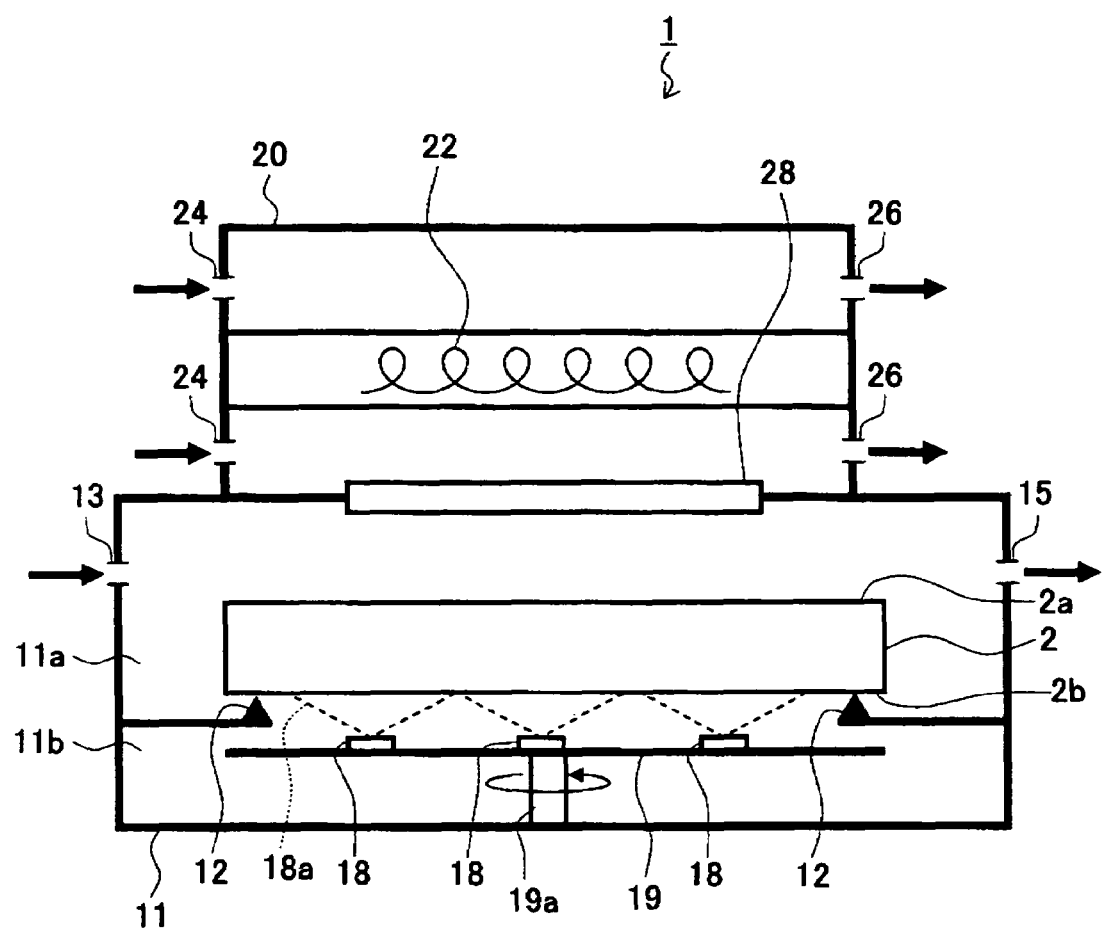
FIG. 3 is a schematic view showing an example of the construction employing a process liquid, of the apparatus for cleaning a substrate according to the present invention.

In a case where a process liquid is to be used, it is preferred to employ a substrate cleaning apparatus 1 having the construction shown in FIG. 3. The substrate cleaning apparatus 1 shown in FIG. 3 is provided with shower nozzles 18 for supplying a process liquid, instead of the inlet 14 and outlet 16 for the process gas or process liquid of the substrate cleaning apparatus 1 shown in FIG. 1. The shower nozzles 18 are installed on a disk-shaped support plate 19 upwardly in the Fig. so that they are capable of jetting a process liquid 18a to the to-be-cleaned surface 2a of the substrate 2. The support plate 19 is rotatable about a shaft 19a at the center. While the support plate 19 is rotated, the process liquid 18a is sprayed from the shower nozzles 18 to the to-be-cleaned surface 2a of the substrate 2, whereby it is possible to supply the process liquid 2a over the entire to-be-cleaned surface 2a of the substrate 2.

In the substrate cleaning apparatus 1 shown in FIG. 1, as the UV light source 22 to emit UV light, any light source may be used so long as it is capable of emitting light having a wavelength within the wavelength region of UV light.

As the UV light, UV light having a wavelength within a range of from 100 to 400 nm may be employed. However, it is preferred to employ UV light having a wavelength of at most 280 nm, whereby removal of a contaminant can be carried out more efficiently. Further, it is preferred to employ UV light having a wavelength of at least 140 nm, whereby attenuation of UV light in the light path to the substrate can be suppressed to a low level even when inexpensive nitrogen gas is used as the atmosphere gas of the first space.

A specific example of the UV light source 22 may, for example, be a mercury lamp (peak wavelength of emission light: 185 nm or/and 254 nm), a dielectric barrier discharge excimer lamp filled with xenon gas (172 nm), a dielectric barrier discharge excimer lamp filled with Ar gas (146 nm), a dielectric barrier discharge excimer lamp filled with XeI (254 nm), a dielectric barrier discharge excimer lamp filled with KrCl gas (222 nm), a fourth harmonic wavelength YAG:Nd laser (266 nm), ArF excimer laser (193 nm), $F_2$ laser (157 nm) and KrF excimer laser (248 nm). Among them, a low pressure mercury lamp, a dielectric barrier discharge excimer lamp filled with xenon gas (172 nm), or a dielectric barrier discharge excimer lamp filled with argon gas, xenon gas, XeI gas or KrCl gas, is preferred, since it emits CW light, and relatively high intensity UV light can be applied to a relatively large area.

The UV light emitted from the UV light source 22 preferably has a light intensity of at least 5 mW/cm$^2$ at the to-be-cleaned surface 2a of the substrate. When the light intensity at the to-be-cleaned surface 2a of the substrate 2 is within the above range, it is possible to generate a sufficient amount of ozone $O_3$, excited state oxygen atoms O(1D) or active oxygen when the UV light is applied. Further, such UV light has a sufficient photon energy capable of dissociating the molecular bond of the organic compound adhered to the to-be-cleaned surface 2a of the substrate thereby to decompose the organic compound into gases such as CO, $CO_2$ and $H_2O$. On the other hand, it is thereby free from a possibility that the glass substrate 2 is damaged by irradiation with extremely strong UV light.

If an excessively high intensity UV light is applied, the substrate will be damaged. Accordingly, it is preferred to adjust the light intensity of the UV light at the to-be-cleaned surface 2a to be at most the upper limit value. Such an upper limit value is required to be smaller as the wavelength of the UV light is shorter. For example, in the case of ArF excimer laser, the upper limit value is 100 mJ/cm$^2$/pulse and in the case of $F_2$ laser, it is 50 mJ/cm$^2$/pulse.

In the present invention, the UV light from the UV light source 22 is, after passing through the glass substrate 2, applied to the to-be-cleaned surface 2a, and the glass substrate 2 is accordingly required to be one to transmit the UV light to be used. For this purpose, the substrate 2 preferably has a transmittance of at least 20% at the wavelength of the UV light to be used.

A specific example of the substrate having such a transmittance may be a synthetic quartz glass substrate, a fused quartz glass substrate, a TiO$_2$-doped quartz glass substrate, a sapphire (Al$_2$O$_3$) substrate, a CaF$_2$ substrate or a MgF$_2$ substrate. Such a substrate may have a coating film formed on each or either one of the substrate surfaces, i.e. on the to-be-cleaned surface 2a or the other surface opposite to the to-be-cleaned surface 2a, so long as the transmittance at the wavelength of the UV light to be used, satisfies the above range. A specific example of the coating film which may be formed on the substrate surface may be MoSiON, MoSiN, TaSiO, Ta, CrFO or Cr. Further, the coating film to be formed on the substrate surface may have a pattern formed. In such a case, it is preferred that the transmittance of the substrate including the coating film is at least 20%.

In the foregoing, the substrate cleaning method and the substrate cleaning apparatus of the present invention are described with reference to the drawings. However, it should be understood that the drawings merely show embodiments of the substrate cleaning apparatus of the present invention, and the substrate cleaning apparatus of the present invention is not limited to the embodiments shown in the drawings. For example, in the substrate cleaning apparatus 1 shown in FIG. 1, the atmosphere in each of the UV light source chamber 20 and the first space 11a is one composed of a gas having a low absorption of UV light, and accordingly, the window 28 structurally dividing the UV light source chamber 20 and the first space 11a may be omitted. If the window 28 is present, the irradiation intensity of the UV light from the UV light source 22 will be decreased due to the absorption by the material of the window. Further, the amount of absorption increases as the irradiation time of UV light passes, and in order to maintain the irradiation intensity of UV light at the to-be-cleaned surface 200a, it is required to periodically change the window. It is advantageous not to use the window, whereby a trouble of changing it is no longer required.

However, the window 28 may be present for the following reason.

The inert gas flowing the UV light source chamber 20 serves also as a cooling medium to prevent overheating of the UV light source 22. For this purpose, the temperature of the inert gas flowing in the UV light source chamber 20 is preferably low. On the other hand, in the case of the inert gas flowing in the first space 11a, the temperature is not required to be low, and from the viewpoint of the cleaning efficiency of the substrate 2, it is not preferable to use a low temperature inert gas. If a low temperature inert gas is permitted to flow in the first space 11a, the temperature of the substrate 2 in contact with the inert gas lowers. If the temperature of the substrate 2 lowers, generation of ozone $O_3$, excited state oxygen atoms O(1D) or active oxygen by the mechanism mentioned above in Background of the Invention also decreases. Further, dissociation of the molecular bond of an organic compound by UV light also decreases. Consequently, the cleaning efficiency of the substrate 2 decreases.

Now, the present invention will be described in further detail with reference to Examples. However, it should be understood that the present invention is by no means restricted by such specific Examples.

Examples 1 to 8 are Examples of the present invention, and Examples 9 and 10 are Comparative Examples. Further, the transmittances for UV lights having wavelengths of 172 nm, 185 nm, 220 nm and 254 nm, of the synthetic quartz glass substrates to be used in the following Examples, are 80%, 90%, 91% and 92%, respectively.

EXAMPLES 1 to 8

A total of eight synthetic quartz glass substrates (size: 6 inch×6 inch×0.25 inch) are prepared. Firstly, by the apparatus shown in FIG. 4, irradiation by a Xe$_2$ excimer lamp was applied for 5 minutes at an illuminance of 10 mW/cm$^2$ at the to-be-cleaned surface in a mixed gas atmosphere of nitrogen gas and oxygen gas (composition of nitrogen gas/oxygen gas: 90/10 vol %), to carry out preliminary cleaning for improvement of the wettability. Here, the illuminance in each Example means an illuminance at the to-be-cleaned surface of the substrate in a prescribed atmosphere.

Thereafter, cleaning is carried out for 10 minutes under the conditions shown in Table 1 by means of the apparatus shown in FIG. 1 or 3. In Examples 1 and 3 to 6, as a lamp to emit UV light, a Xe$_2$ excimer lamp (a dielectric barrier discharge excimer lamp filled with xenon gas) is used, and the illuminance is set to be 10 mW/cm². In Examples 2 and 8, as a lamp to emit UV light, a low pressure mercury lamp having emission line wavelengths of 254 nm and 185 nm is employed. Here, the illuminance at the to-be-cleaned surface of the UV light having a wavelength of 254 nm is set to be 20 mW/cm². Further, in Example 7, as a lamp to emit UV light, a KrCl excimer lamp is employed, and the illuminance at the to-be-cleaned surface of the UV light having a wavelength of 220 nm is set to be 10 mW/cm². The number of convex contaminants before and after cleaning by means of the apparatus shown in FIG. 1 or 3 is counted by using a defect inspecting machine (e.g. M1350, manufactured by Lasertec Corporation).

Further, in Examples 2 to 6 wherein a process liquid is employed as the atmosphere in the second space 11*b*, following this cleaning step, the substrate is rinsed with deionized water at 150 rpm for 3 minutes by using a sheet-feed cleaning machine (e.g. ASC5500, manufactured by Hamatech) and subjected to spin drying at 1,200 rpm for one minute to remove droplets adhered to the substrate surface. Further, the flow rate of the cleaning liquid or a mixed gas to each atmosphere in the preliminary cleaning and in the cleaning employing a mixed gas or a cleaning liquid is 1 liter/min in every case.

EXAMPLE 9

The same synthetic quartz glass substrates as in Examples 1 to 8 (size: 6 inch×6 inch×0.25 inch) are prepared, and firstly, preliminary cleaning is carried out in the same manner for the improvement of the wettability, and then, using the apparatus shown in FIG. 4, irradiation by a $Xe_2$ excimer lamp (illuminance: 10 mW/cm²) is carried out for 10 minutes in an atmosphere of a mixed gas of nitrogen gas and oxygen gas (composition of nitrogen gas/oxygen gas is 50/50 vol %, and the flow rate is 1 liter/min) to carry out the cleaning step. The number of convex contaminants before and after the cleaning employing the apparatus shown in FIG. 4, is counted by means of a defect inspecting machine (e.g. M1350, manufactured by Lasertec Corporation).

EXAMPLE 10

The same synthetic quartz glass substrate as in Examples 1 to 8 (size: 6 inch×6 inch×0.25 inch) is prepared, and by the apparatus shown in FIG. 4, in the same manner as in Examples 1 to 8, irradiation by a $Xe_2$ excimer lamp was carried out at an illuminance of 10 mW/cm² for 5 minutes in a mixed gas atmosphere of nitrogen gas and oxygen gas (composition of nitrogen gas/oxygen gas: 90/10 vol %) to carry out cleaning. The number of convex contaminants before and after the cleaning is counted by means of a defect inspecting machine (for example, M1350, manufactured by Lasertec Corporation).

The contaminant removal rate PRE (%) by cleaning can be obtained by the following formula.

$$PRE(\%) = (1 - N_{post}/N_{pre}) \times 100$$

Here, $N_{pre}$: the number of convex contaminants detected before cleaning $N_{post}$: the number of convex contaminants detected after cleaning In Examples 1 to 8, convex contaminants adhered to the substrate surface can effectively be removed. Especially in Examples 2 to 8 wherein a process liquid is employed, convex contaminants adhered to the substrate surface can more effectively be removed. Further, in Example 3 wherein deionized water containing an oxidizing agent is employed as a process liquid, in Example 6 wherein an acidic aqueous solution is employed and in Examples 4 and 5 wherein a basic aqueous solution is employed, convex contaminants adhered on the substrate surface can particularly effectively be removed.

In Examples 9 and 10, the UV light is attenuated before it reaches the to-be-cleaned surface of the substrate, and accordingly, it is not possible to effectively remove convex contaminants adhered to the surface.

TABLE 1

| Ex. No. | Construction of cleaning apparatus | Atmosphere of first space (gas having low absorption of UV light) | Atmosphere of second space (process gas or process liquid) | UV light source (main wavelength) |
|---|---|---|---|---|
| 1 | FIG. 1 | Nitrogen gas | Mixed gas of nitrogen gas/oxygen gas (50/50 vol %) | $Xe_2$ excimer lamp (about 172 nm) |
| 2 | FIG. 3 | Nitrogen gas | Deionized water (pH = 7) | Low pressure mercury lamp (about 254 nm) |
| 3 | FIG. 3 | Nitrogen gas | Deionized water containing 50 mass ppm of ozone (pH = 5) | $Xe_2$ excimer lamp (about 172 nm) |
| 4 | FIG. 3 | Nitrogen gas | Deionized water containing 1 mass % of ammonia (pH = 10) | $Xe_2$ excimer lamp (about 172 nm) |
| 5 | FIG. 3 | Nitrogen gas | Mixed aqueous solution containing 1 mass % of ammonia and 0.5 mass % of hydrogen peroxide (pH = 10) | $Xe_2$ excimer lamp (about 172 nm) |
| 6 | FIG. 3 | Nitrogen gas | 1 mass % hydrochloric acid aqueous solution (pH = 2) | $Xe_2$ excimer lamp (about 172 nm) |
| 7 | FIG. 3 | Nitrogen gas | Mixed aqueous solution containing 1 mass % of ammonia and 0.5 mass % of hydrogen peroxide (pH = 10) | KrCl excimer lamp (about 220 nm) |
| 8 | FIG. 3 | Nitrogen gas | Deionized water containing 50 mass ppm of ozone (pH = 5) | Low pressure mercury lamp (about 254 nm) |

What is claimed is:

1. A method for cleaning a substrate comprises irradiating the substrate to be cleaned, with ultraviolet light or vacuum ultraviolet light (hereinafter referred to simply as the UV light), wherein the substrate to be cleaned is a substrate having a transmittance of at least 20% at the wavelength of the UV light; a second space containing a surface on the side of the substrate on which the cleaning is to be carried out (hereinafter referred to as the to-be-cleaned surface) and its vicinity, is an atmosphere comprising a gas (hereinafter referred to as the process gas) or a liquid (hereinafter referred to as the process liquid), which generates at least one of ozone, excited state oxygen atoms and active oxygen species by the irradiation with the UV light; a first space containing a surface on the other side of the substrate (hereinafter referred to as the to-be-irradiated surface) is an atmosphere comprising a gas showing a low absorption of the UV light; and the UV light is permitted to enter via the first space into the to-be-irradiated surface of the substrate, then pass through the interior of the substrate and then be applied to the to-be-cleaned surface.

2. The method for cleaning a substrate according to claim 1, wherein the UV light is emitted from at least one UV light source selected from the group consisting of a mercury lamp (peak wavelength of emitted light: 185 nm and/or 254 nm), a dielectric barrier discharge excimer lamp filled with xenon gas (172 nm), a dielectric barrier discharge excimer lamp filled with KrCl gas (222 nm), a dielectric barrier discharge excimer lamp filled with XeI gas (254 nm), a dielectric barrier discharge excimer lamp filled with Ar gas (146 nm), a fourth harmonic wavelength YAG:Nd laser (266 nm), an ArF excimer laser (193 nm), a $F_2$ laser (157 nm) and a KrF excimer laser (248 nm).

3. The method for cleaning a substrate according to claim 1, wherein the irradiation intensity of the UV light applied to the substrate is at least 5 mW/cm$^2$ at the to-be-cleaned surface of the substrate.

4. The method for cleaning a substrate according to claim 1, wherein the process gas is a gas comprising either $O_2$ gas, water vapor, or $O_2$ gas and water vapor.

5. The method for cleaning a substrate according to claim 4, wherein the process gas has a $O_2$ concentration of from 1 to 100%.

6. The method for cleaning a substrate according to claim 5, wherein the process gas has a $O_2$ concentration of from 20 to 100%.

7. The method for cleaning a substrate according to claim 1, wherein the process liquid is either deionized water, deionized water containing a surfactant, deionized water containing an oxidizing agent, an aqueous acidic solution or an aqueous alkaline solution.

8. The method for cleaning a substrate according to claim 1, wherein the substrate is one selected from the group consisting of a synthetic quartz glass substrate, a fused quartz glass substrate, a $TiO_2$-doped quartz glass substrate, a sapphire ($Al_2O_3$) substrate, a $CaF_2$ substrate and a $MgF_2$ substrate.

9. The method for cleaning a substrate according to claim 8, wherein the substrate is a synthetic quartz glass substrate having a water content of at most 500 ppm or an ultra-low thermal expansion glass substrate having a thermal expansion coefficient of at most 10 ppb/K.

* * * * *